United States Patent [19]

Duderstadt et al.

[11] Patent Number: 5,238,752
[45] Date of Patent: Aug. 24, 1993

[54] THERMAL BARRIER COATING SYSTEM WITH INTERMETALLIC OVERLAY BOND COAT

[75] Inventors: Edward C. Duderstadt, Fairfield; Bangalore A. Nagaraj, West Chester, both of Ohio

[73] Assignee: General Electric Company, Cincinnati, Ohio

[21] Appl. No.: 520,017

[22] Filed: May 7, 1990

[51] Int. Cl.⁵ ............................................. B21D 39/00
[52] U.S. Cl. ....................................... 428/623; 428/629; 428/632; 428/633; 416/241 B
[58] Field of Search ............... 428/623, 632, 633; 416/241 B; 482/629

[56] References Cited

U.S. PATENT DOCUMENTS

| | | | |
|---|---|---|---|
| 3,898,052 | 8/1975 | Dean et al. | 428/632 |
| 4,095,003 | 6/1978 | Weatherby et al. | 428/632 |
| 4,248,940 | 2/1981 | Goward et al. | 428/633 |
| 4,255,495 | 3/1981 | Levine et al. | 428/632 |
| 4,269,903 | 5/1981 | Clingman et al. | 428/623 |
| 4,321,310 | 3/1982 | Ulion et al. | 428/632 |
| 4,321,311 | 3/1982 | Strangman | 428/623 |
| 4,399,199 | 8/1983 | McGill et al. | 428/633 |
| 4,485,151 | 11/1984 | Stecura | 428/633 |
| 4,576,874 | 3/1986 | Spengler et al. | 428/632 |
| 4,615,865 | 10/1986 | Duvall et al. | 420/588 |
| 4,639,399 | 1/1987 | Aprigliano | 428/623 |
| 4,861,618 | 8/1989 | Vine et al. | 427/34 |
| 4,880,614 | 11/1989 | Strangman et al. | 428/623 |
| 4,889,776 | 12/1989 | Priceman | 428/629 |
| 4,900,640 | 2/1990 | Bell et al. | 428/678 |

FOREIGN PATENT DOCUMENTS 0304176 2/1989 European Pat. Off. ............ 428/632

Primary Examiner—Donald P. Walsh
Assistant Examiner—Ngoclan T. Mai
Attorney, Agent, or Firm—Jerome C. Squillaro; Carmen Santa Maria

[57] ABSTRACT

A thermal barrier coating system for high temperature superalloys includes an intermetallic bond coating on the substrate and a ceramic topcoat having a columnar grain structure with the columnar axis perpendicular to the surface of the coating. The intermetallic coating is preferably a nickel aluminide or a platinum aluminide, whose upper surface is oxidized during processing to form a thin layer of predominantly aluminum oxide. The ceramic topcoat is preferably zirconium oxide having from about 6 to 20 percent yttrium oxide.

19 Claims, 3 Drawing Sheets

THERMAL BARRIER COATING SYSTEM WITH INTERMETALLIC OVERLAY BOND COAT

BACKGROUND OF THE INVENTION

This invention relates to nickel-based and cobalt-based superalloys, and, more particularly, to thermal barrier coating systems that protect such superalloys from oxidation and corrosion attack during operation.

One of the most demanding materials applications in current technology is found in turbine components used in aircraft jet engines. The higher the operating temperature of an engine, the greater its efficiency, and the more power it can produce from each gallon of fuel. There is therefore an incentive to operate such engines at as high a temperature as possible. One critical limitation on the operating temperature of an engine is the materials used in the hottest regions of the engine, such as gas turbine blades and vanes.

There has been an extraordinary amount of effort over the past 40 years to develop materials that can be used in high temperature engine applications. The currently most popular and successful of such materials are the nickel-based superalloys, which are alloys of nickel with additions of other elements such as chromium, cobalt, aluminum, tantalum, yttrium, and many others. Cobalt-based superalloys are also used in some situations. The compositions of these superalloys are carefully engineered to maintain their strength and other desirable properties even during use at the high temperature of engine operation, which is in the neighborhood of 2000° F.

High operating temperatures can also be achieved by other techniques not related directly to the alloy compositions used in the components. For example, control of grain structures and use of single crystal components can result in improved properties. Cooling passages may be provided in the components, and cooling air passed through them.

In another approach that is the primary focus of the present invention, an insulating layer of a material having low thermal conductivity is deposited upon the component. This insulating layer, termed a thermal barrier coating or TBC, creates a thermal gradient from the surface of the superalloy component to the environment, so that the metallic component may be operated at a higher environmental or air temperature than otherwise might be possible. The insulating layer must protect the metallic structure from heat in this manner, be adherent to the superalloy substrate, and remain adherent through many cycles of heating to the operating temperature and then cooling back to ambient temperature when the engine is turned off. Because ceramics and metals have different coefficients of thermal expansion, cycles of heating and cooling tend to cause the ceramic coating to crack and spall off, which results in the superalloy being overheated in the area of the defect.

Ceramic coatings can act as thermal insulation for superalloy parts, but considerable care must be taken to ensure that the coating adheres well to the surface of the superalloy part, and remains adherent through many thermal cycles. To improve the adhesion and maintenance of adhesion of the ceramic coating, and to provide oxidation resistance for the underlying substrate, metallic bond coatings have been developed. The bond coatings are metallic compositions selected to form a stable, adherent surface oxide scale that protects the substrate from rapid oxidation. The combination of the ceramic coating, the metallic bond coating, and other constituents that might be present to protect the substrate is known as a thermal barrier coating (TBC) system.

In one approach to a thermal barrier coating system, a bond coat layer of metallic MCrAlY, where M is iron, nickel, or cobalt, or a mixture thereof, is first deposited upon the superalloy substrate. The surface of the bond coat is oxidized to produce a layer of protective predominantly aluminum oxide overlying the bond coat. The ceramic coating is then deposited on top of the aluminum oxide. If the ceramic coating is properly applied, it may have the form of separated columns extending perpendicular to the surface of the coating and the part, such as illustrated in FIG. 1 of each of U.S. Pat. Nos. 4,321,310 and 4,321,311.

Although such an approach may be useful, there is a continuing need for further improvements in thermal barrier coating systems. The present invention fulfills this need, and further provides related advantages.

SUMMARY OF THE INVENTION

The present invention provides a thermal barrier coating system which utilizes the proven prior approach of a ceramic topcoat and an underlying layer that provides a transition to the metallic substrate. The modified system results in improved thermal cycling performance through a modification to the underlying layer.

In accordance with the invention, a superalloy article having a thermal barrier coating thereon comprises a substrate made of a material selected from the group consisting of a nickel-based superalloy and a cobalt-based superalloy; and a thermal barrier coating system on the substrate, the thermal barrier coating system including an intermetallic coat or intermetallic bond coat overlying the substrate, the coating being selected from the group consisting of a nickel aluminide and a platinum aluminide, and a ceramic topcoat overlying the intermetallic bond coat. Aluminides, as distinguished from metals, are ordered structures including aluminum and another metal.

More specifically, a superalloy article having a thermal barrier coating system thereon comprises a substrate made of a superalloy; and a thermal barrier coating system on the substrate, the thermal barrier coating system including an aluminide intermetallic bond coat upon the substrate, the bond coat being selected from the group consisting of a nickel aluminide and a platinum aluminide, and having a thickness of from about 0.001 to about 0.005 inches thick, a layer of aluminum oxide upon the intermetallic bond coat, the layer of aluminum oxide being from about $1.2 \times 10^{-6}$ to $1.2 \times 10^{-4}$ inches thick, and a ceramic topcoat upon the layer of aluminum oxide, the ceramic topcoat having a composition of zirconium oxide plus from about 6 to about 20 weight percent yttrium oxide and a columnar grain structure wherein the columnar axis is substantially perpendicular to the surface of the thermal barrier coating.

The invention also extends to a process for preparing such a coated article. In accordance with this aspect of the invention, a process for preparing a superalloy article having a thermal barrier coating system thereon comprises furnishing a substrate made of a superalloy; depositing upon the surface of the substrate an aluminide intermetallic bond coat selected from the group consisting of a nickel aluminide and a platinum aluminide; oxidizing to form an aluminum oxide layer that has a substantially smooth upper surface; and depositing upon the surface of the predominantly aluminum oxide layer a ceramic topcoat by physical vapor deposition. Preferably, during processing the upper surface of the aluminide intermetallic coating is oxidized to produce a thin layer of aluminum oxide.

The thermal barrier coating system of the invention is useful in protecting a variety of both nickel-based and cobalt-based superalloys, and no further limitation is known as to the substrate selected. The substrate is carefully cleaned, if necessary, and a thin bond coat layer of the aluminide is formed on the surface of the substrate by a pack cementation process, or other technique that may be appropriate. Where the pack cementation process is used, the aluminide is formed by the diffusion of aluminum atoms into the superalloy substrate. At the same time, small amounts of alloying elements present in the substrate normally diffuse into the bond coat layer. The chemical composition through the bond coat layer is therefore not constant, but exhibits a gradient. However, the outer surface of the bond coat layer is a nickel aluminide intermetallic compound, or, where platinum was plated or deposited onto the substrate prior to deposition of aluminum, a platinum aluminide intermetallic compound.

The composition of the preferred nickel aluminide intermetallic compound is near the equiatomic composition NiAl wherein equal numbers of nickel and aluminum atoms are present. The layer may also include other nickel aluminide binary or higher order intermetallics. Small additions of other elements may be present, either as modifiers intentionally added to the bond coat layer or as a result of diffusion from the substrate. Such additions typically include a few percent of chromium or smaller amounts of tantalum, titanium, cobalt, or yttrium. The term "nickel aluminide" encompasses both unmodified nickel aluminide and other modified nickel aluminides such as nickel chromium aluminides. Similarly, the term "platinum aluminide" encompasses both unmodified platinum aluminide and modified platinum aluminides such as platinum rhodium aluminide.

After it is deposited, the aluminide intermetallic bond coat is preferably oxidized to convert the portion which is furthest from the substrate, also referred to as the outer portion, to a very thin layer of aluminum oxide, which affords protection to the substrate against oxidation and corrosion during use of the substrate, and also aids in bonding the ceramic topcoat to the substrate. The aluminide is grit cleaned and degreased before the oxidation treatment commences and the aluminum oxide is formed. The aluminum oxide layer is only about $1.2 \times 10^{-6}$ to $1.2 \times 10^{-4}$ inches thick, yet provides excellent oxidation protection to the underlying substrate. Because the aluminide oxidizes rapidly, oxidation occurs during conventional processing so that a separate oxidation step is not normally required. The protective layer of aluminum oxide usually is formed during preheating prior to deposition of the ceramic topcoat.

The topcoat deposited overlying the aluminide bond coat layer (and the aluminum oxide layer) is a ceramic. The topcoat is preferably zirconium oxide doped with about 8 percent by weight of yttrium oxide or from about 15 to about 40 percent by weight of cerium oxide, and is preferably deposited upon the oxidized surface of the aluminide layer by physical vapor deposition, so as to form columnar grains of the ceramic. The columnar ceramic grains have their long axes perpendicular to the surface of the aluminum oxide layer (and the aluminide bond coat layer) and the substrate, improving the resistance of the topcoat to spalling during thermal cycling of the protected substrate.

The present approach offers important advantages over the thermal barrier coating approaches of the past. The intermetallic aluminide bond coating may be made thinner than the metallic MCrAlY coatings used in some prior approaches, while retaining effectiveness as to both corrosion and oxidation damage, and aiding in attaining a good bond between the topcoat and the substrate. It also reduces the weight of the coated article, as compared with an MCrAlY bond coat, an important consideration that in turn permits the weight of the supporting structure, such as a turbine disk, to be reduced.

Other features and advantages of the invention will be apparent from the following more detailed description of the preferred embodiment, taken in conjunction with the accompanying drawings which illustrate, by way of example, the principles of the invention.

DETAILED DESCRIPTION OF THE PREFERRED EMBODIMENT

Figure 1:
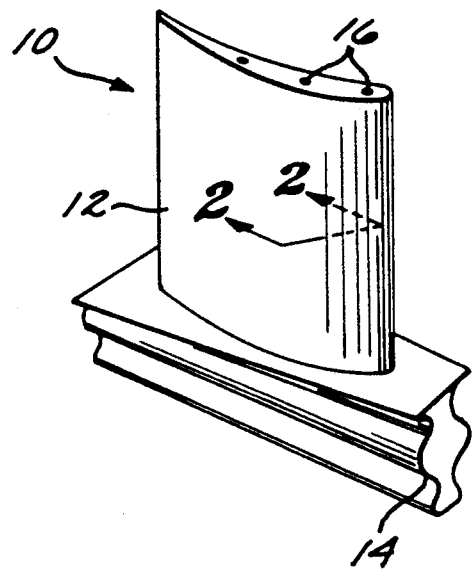
FIG. 1 is a perspective view of a turbine blade having a thermal barrier coating.

In the most preferred embodiment, the thermal barrier coating system of the invention is used with nickel-based or cobalt-based superalloys, in applications such as a jet engine gas turbine blade 10 illustrated in FIG. 1. The blade is formed of a nickel-based superalloy such as Rene 80 or any other high-temperature nickel-based (or cobalt-based) superalloy. Such a blade 10 includes an airfoil section 12 against which hot combustion gases are directed when the engine operates, and whose surface is subjected to severe oxidation and corrosion attack during service. If the surface of the airfoil section 12 is not protected against oxidation and corrosion in some fashion, it will normally last at most only a few cycles of operation. The airfoil section 12 is anchored to a turbine disk (not shown) through a root section 14. In some cases, cooling passages 16 are present through the airfoil section 12, through which bleed air is forced to carry away heat from the blade 10. The blade 10 is normally prepared by casting and solidification procedures well known to those skilled in the art, such as investment casting or, more preferably, directional solidification or single crystal growth.

According to the present invention, the airfoil section 12 is protected by a thermal barrier coating system 20. The coating system 20 is illustrated in detail in FIG. 2, which depicts an enlargement of a section through the surface portion of the blade 10. The nickel-based superalloy of the blade 10 forms a substrate 22 upon which and over which the thermal barrier coating system 20 is deposited.

A key objective of the thermal barrier coating system approach is to interpose a ceramic insulation layer between the hot combustion gases of the environment and the substrate of the blade or other component. The ceramic insulation layer acts much like other more common types of insulation, preventing the high temperature gases from contacting the metallic substrate. Alternatively stated, the ceramic layer creates a thermal gradient between the environment and the metal of the blade. Where present, the air flow through the cooling air passages 16 maintains the interior of the blade 10 at a reduced temperature as compared with the combustion gas environment, thereby permitting the blade 10 and the gas turbine to be operated at a higher combustion gas environmental temperature than would otherwise be possible.

Experience has shown that a ceramic insulation layer cannot be deposited directly upon the metallic substrate, in part because the adhesion between the two different materials is not sufficiently great, and in part because the difference in thermal expansion of the ceramic and metal causes the ceramic to crack and spall off during thermal cycling. That is, when the blade is heated and cooled as the engine is turned on, operated at different power levels, and turned off, the difference in thermal expansion coefficients causes cracks to develop in the brittle ceramic. The cracks propagate through particular regions, and eventually flakes of the ceramic are separated from the substrate in the affected regions, a process known in the art as spalling. The exposed metallic substrate in those regions is then rapidly degraded by the hot gases. After spalling occurs in a region of a blade, its life before failure is usually quite short.

In order to ensure good adhesion and to avoid spalling failures, the thermal barrier coating system includes a bond coat or intermediate layer between the ceramic and the substrate 22. The preferred intermediate layer of the invention is an intermetallic nickel aluminide such as the compound NiAl or $Ni_2Al_3$, or a modified intermetallic compound such as NiAl-Cr. As shown in the sectional view of FIG. 2 and the process flow chart of FIG. 3, an intermetallic bond coating 24 is deposited upon the substrate 22 by any acceptable technique, here preferably pack cementation. The intermetallic bond coat 24 is typically about 0.001 to about 0.005 inches thick, as deposited.

Operable pack cementation processes are described in detail in U.S. Pat. Nos. 3,415,672 and 3,540,878, which disclosures are herein incorporated by reference. Briefly, as such a process is practiced in relation to the present invention, the cleaned substrate is packed in a bed made of a mixture of an inert powder, such as aluminum oxide $Al_2O_3$, an aluminum source alloy such as described in the '878 patent, and an activator such as ammonium chloride $NH_4Cl$ or ammonium fluoride $NH_4F$. A preferred source alloy has a composition of 50 to 70 weight percent titanium, 20–48 weight percent aluminum, and 0.5–9 weight percent carbon. The bed and substrate are heated to a temperature in excess of 1800° F. for a time that is typically about 240 minutes or more, so that aluminum diffuses from the packed bed into the substrate. In a more specific example, a superalloy piece packed in a blended powder mixture consisting of 3 weight percent of a source alloy such as that described above, 0.1 weight percent ammonium fluoride, balance aluminum oxide is heated in a hydrogen atmosphere for 240 minutes at 1975° F. to produce a desirable nickel aluminide intermetallic coating.

Intermetallic coat 24 is preferably a nickel aluminide intermetallic material, or a variation thereof, having a composition near the equiatomic composition in the nickel-aluminum system. That is, the nickel aluminide has about equal numbers of nickel and aluminum atoms. (This composition is about 31.5 percent by weight aluminum, balance nickel.) The terms "balance nickel" and "balance cobalt" are used to include, in addition to nickel or cobalt in the balance of an alloy, small amounts of impurities and incidental elements, which in character and/or amount do not adversely affect the advantageous aspects of the invention. Small compositional modifications may be made to the nickel aluminide, such as, for example, the addition of a few percent of chromium, tantalum, titanium, cobalt, or yttrium. These modifications are normally not intentionally added to the nickel aluminide, as through the pack cementation process. Instead, the alloying elements diffuse into the intermetallic bond coat 24 from the substrate 22.

The nickel aluminide of the invention is to be clearly distinguished from metallic MCrAlY bond coats previously used in the art. Such bond coats are disclosed in U.S. Pat. Nos. 4,321,310 and 4,321,311, whose disclosures are incorporated herein by reference. A typical MCrAlY alloy of the art is disclosed in Example 1 of the '310 patent and Example 1 of the '311 patent. This MCrAlY alloy has about 12.5 weight percent aluminum and 0.3 weight percent yttrium. Its composition is not close to the intermetallic nickel aluminide composition having about 31.5 weight percent aluminum. The compositions differ not only quantitatively, as indicated, but qualitatively in the sense that the MCrAlY composition is a metallic solid solution at the operating temperature of the gas turbine, while the nickel aluminide is an intermetallic compound of the nickel-aluminum system. The addition of small amounts of the indicated modifiers, such as chromium, to the basic nickel aluminide does not alter the intermetallic character of the nickel aluminide. Any additions to the nickel aluminide are limited by this restraint, that the intermetallic character may not be lost through the addition.

An aluminum oxide layer 28 is preferably formed at surface 26 of intermetallic bond coat layer 24. The aluminum oxide layer 28 aids in maintaining the adhesion of the ceramic topcoat to the intermetallic bond coat 24 and thence to the substrate 22 during constant temperature and thermal cycling exposure. The aluminum oxide layer also provides protection against oxidation and corrosion of intermetallic bond coat 24 and the substrate 22. The oxide layer 28 is at least about $1.2 \times 10^{-6}$ inches, preferably from about $1.2 \times 10^{-6}$ to about $1.2 \times 10^{-4}$ inches, in thickness. Because such a thin layer forms rapidly upon heating, a separate step of oxidation is normally not required. The oxidation occurs during normal preheating of the coated substrate prior to deposition of the ceramic topcoat, to be described next. The term "aluminum oxide" as used herein encompasses unmodified aluminum oxide as well as modified forms of aluminum oxide containing small amounts of additional elements such as nickel, cobalt, chromium or other elements. Elements such as nickel and chromium may then form other oxides such as chromium oxide or nickel oxide. These elements are present in the oxide as a result of diffusion from the substrate or as modifiers intentionally added to the bond coat layer.

A ceramic topcoat 30 is deposited overlying the aluminum oxide layer 28 and thence intermetallic bond coat 24. Ceramic topcoat 30 provides the greatest part of the thermal insulation to substrate 22. The preferred thermal topcoat 30 is zirconium oxide, either without modification but most preferably with a small amount of a modifier added. A preferred modifier is yttrium oxide, in an amount of from about 6 to about 20 weight percent, and most preferably in an amount of about 8 weight percent of the total weight of the topcoat 30. Ceramic topcoat 30 is typically about 0.005 to about 0.015 inches thick.

Figure 4:
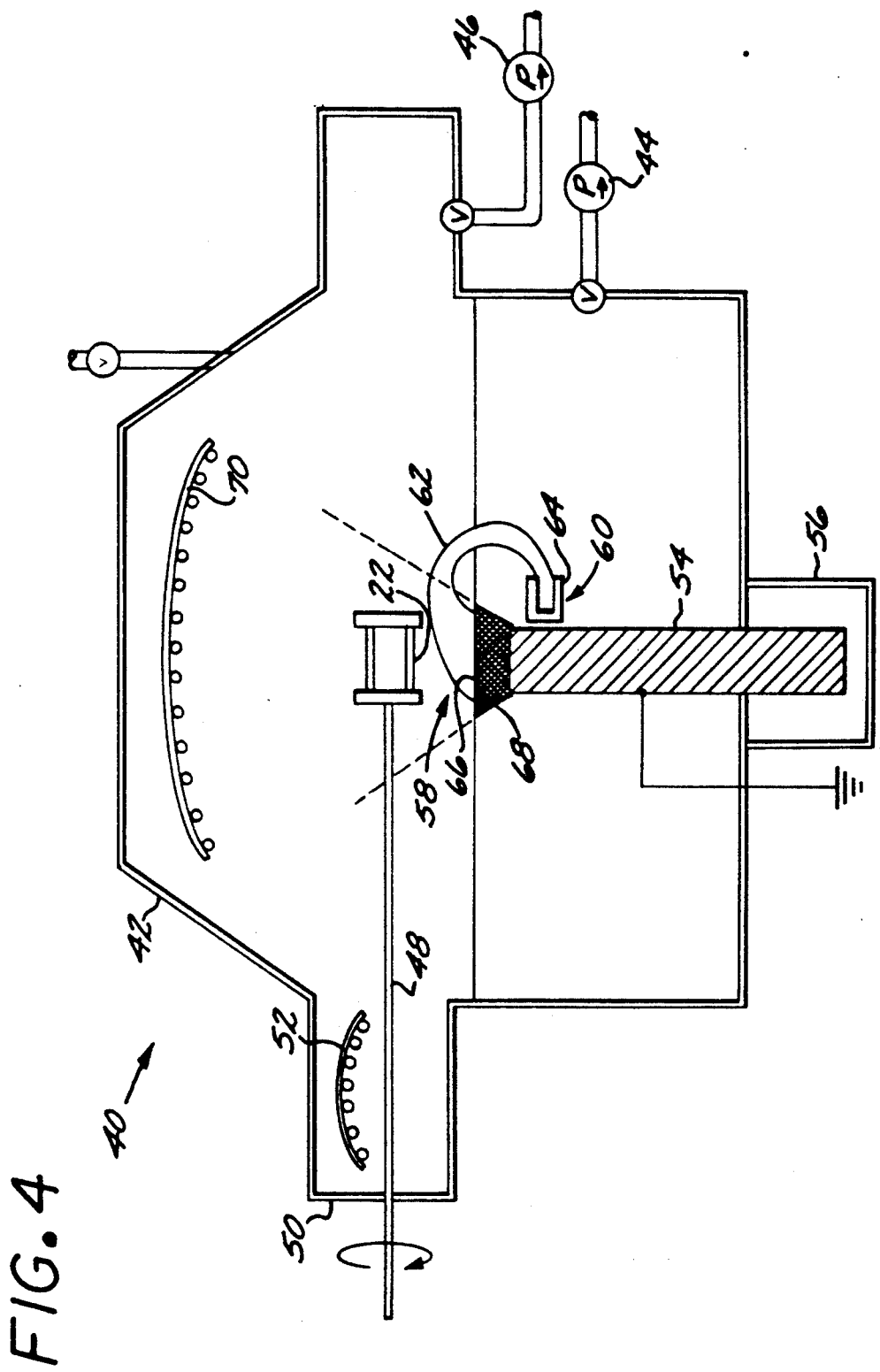
FIG. 4 is a schematic view of a physical vapor deposition apparatus used to deposit the ceramic top coating.

Ceramic topcoat 30 is preferably deposited using a physical vapor deposition approach of the type illustrated in FIG. 4. A physical vapor deposition apparatus 40 includes a vacuum chamber 42 that is sealed leak tight to high vacuum. A mechanical pump 44 and a diffusion pump 46 pump the sealed chamber to a vacuum of about $5 \times 10^{-5}$ Torr, when the apparatus 40 is operated.

Substrate 22 upon which deposition is to occur is supported on a rotatable support 48 and placed into the chamber 42 through a vacuum lock 50. Adjacent the vacuum lock 50 is a preheater 52 that may be used to preheat the substrate 22 to clean it and bring it close to its temperature during deposition, prior to deposition.

The oxidation of the intermetallic bond coat 24 to produce the aluminum oxide layer 28 may be accomplished prior to inserting the intermetallic bond coated substrate 22 into the chamber 42. Alternatively, and preferably, the oxidation is accomplished in the preheater 52. The preferred oxidizing atmosphere is air at a pressure of $5 \times 10^{-5}$ Torr. A period of up to about 10 minutes exposure of the substrate, while being heated to a temperature of about 1800°F., is sufficient to oxidize the surface 26 of the intermetallic bond coat 24 to a thickness of about $2 \times 10^{-5}$ inches, the most preferred thickness.

An ingot 54 of the ceramic material to be deposited to form ceramic topcoat 30 upon the intermetallic bond coated substrate is inserted into the chamber 42 through an ingot airlock 56. The top of the ingot 54 is positioned adjacent the surface of the intermetallic bond coated substrate 22 to be ceramic coated, as indicated at numeral 58 of FIG. 4. An electron beam gun 60 is disposed adjacent the top of the ingot 54 so that a beam of electrons 62 produced by the gun 60 is directed by the appropriate deflection plates (shown in part at numeral 64) to impact the upper surface 66 of the ingot 54. The upper surface 66 is melted by the energy of the electrons, to form a molten pool of the material to be deposited. A crucible 68 may be provided to contain the molten pool, or the electron beam may be so directed so that only the central portion of the upper surface 66 is melted, and the remainder of the ingot provides the containment for the molten pool. In either case, the intense heating by the electron beam 62 causes atoms from the top surface 66 of the molten pool to evaporate and travel upwardly, striking and depositing upon the substrate 22. A substrate heater 70 is positioned above and behind the substrate 22, to provide heating from above the substrate, as may be required in addition to the heat provided from below the substrate by the depositing material and the radiation from the top surface 66.

Figure 2:
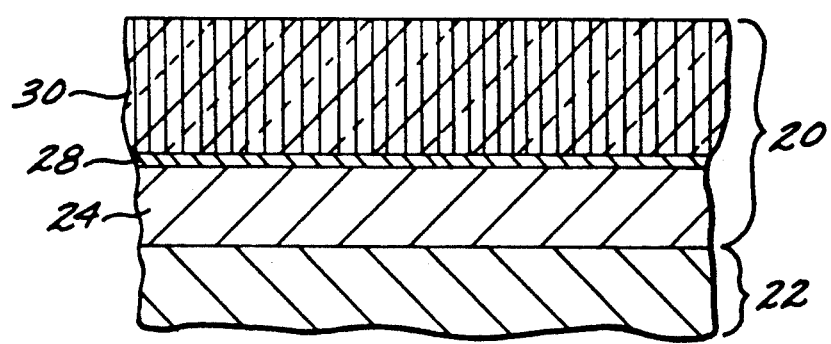
FIG. 2 is an enlarged sectional view of the turbine blade of FIG. 1, taken along lines 2—2.
Figure 3:
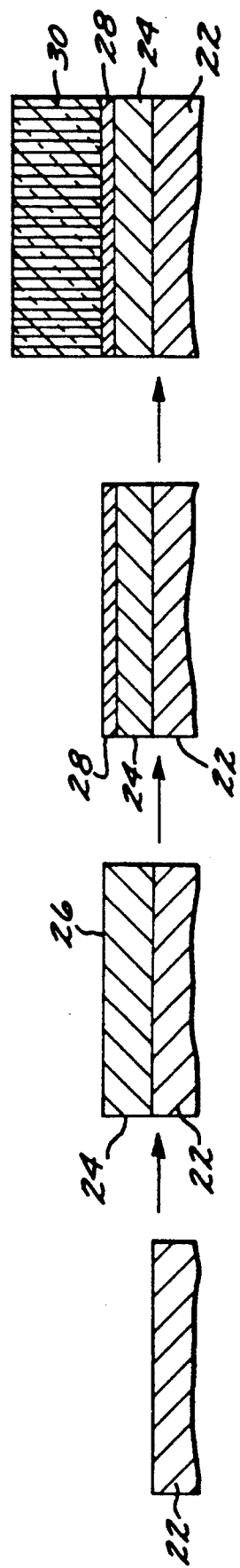
FIG. 3 is a pictorial flow diagram for the preparation of the turbine blade of FIG. 1, showing the surface structure of the blade at each stage of manufacture.

In depositing the ceramic topcoat 30, the chamber is pumped to a vacuum of about $5 \times 10^{-5}$ Torr. The electron beam gun is operated to deposit the ceramic at a rate of about 0.005–0.010 inches per hour. The substrate 22 on the support 48 is rotated in the beam. The substrate is preheated to a temperature of about 1700–1900°F., preferably about 1800°F. Under these operating conditions, the deposited topcoat 30 exhibits a columnar grain structure having the long axis of the columns perpendicular to the surface of the substrate 22, and perpendicular to the surface of the aluminum oxide layer 28 and the intermetallic bond coat 24. The grains are not physically separated from each other in the manner illustrated in FIG. 1 of the '310 patent and FIG. 1 of the '311 patent, however, but are contiguous in the lateral direction. The illustration of FIG. 2 schematically depicts the orientation of the columnar grains 32 of the topcoat 30. This columnar grain structure and orientation has been confirmed by light microscope observation of deposited structures.

After deposition of the topcoat 30, the substrate and deposited layers are given a final heat treatment. The preferred heat treatment is 4 hours at 1975°F. in vacuum, followed by ½ hour at 1300°F. in air.

The following examples are intended to illustrate aspects of the invention, and should not be taken as limiting of the invention in any respect.

EXAMPLE 1

Four gas turbine blades, each having a length of about two inches and made of the alloy Rene 108, had a thermal barrier coating applied by the procedure described previously. The blades were successfully coated with an aluminide bond coat by a pack cementation process, and thereafter coated with a ceramic topcoat of nominal composition zirconium oxide-8 weight percent yttrium oxide to a thickness of about 0.005 inches.

The alloys for the blades were melted under a vacuum atmosphere and investment cast in the manner commonly used for aircraft-quality blades, as is well known in the art. Rene 108 has a nominal composition of 8.4 weight percent chromium, 9.5 weight percent cobalt, 9.5 weight percent tungsten, 5.5 weight percent aluminum, 3.05 weight percent tantalum, 1.5 weight percent hafnium, 0.7 weight percent titanium, 0.5 weight percent molybdenum, 0.08 weight percent carbon, 0.012 weight percent zirconium, 0.015 weight percent boron, balance nickel.

The blades were successfully coated by the following procedure. The blades were first cleaned using standard degreasing solvents. The bond coat was applied to the blades by pack cementation. The cleaned parts were packed in a bed made up of about 96 percent aluminum oxide powder, about 4 percent aluminum source alloy, and about 0.1 percent ammonium fluoride powder. The composition of the aluminum source alloy was about 35 percent aluminum, about 5 percent carbon, and the remainder titanium. The bed and parts were heated to a temperature of 1975°F. for 4 hours in a hydrogen atmosphere.

The upper surface of the bond coat was oxidized to form a layer of predominantly aluminum oxide by heating in the preheat chamber prior to application of the top coat. The thickness of the oxide was not measured, but is expected to be about 0.05 micrometers based upon measurements of specimens treated similarly.

The ceramic topcoat 30 was applied to the leading edge of the blades over the top of the oxidized layer using the electron beam physical deposition apparatus previously described in relation to FIG. 4. The top coat was applied suing conventional electron beam physical deposition methods.

The coated blades were cyclic furnace tested in a cycle consisting of a 10 minute heat up to 2000°F., a 45 minute hold at 2000°F., and a 10 minute cooling period in flowing air to about 200° F. The coating survived over 100 such cycles and was therefore considered to be successful.

EXAMPLE 2

Six button specimens made of the commercially available alloy X40 were successfully coated using the procedures described previously. Alloy X40 is a cobalt-based superalloy having a nominal composition of 25.5 weight percent chromium, 10.5 weight percent nickel, 7.5 weight percent tungsten, 2.0 weight percent iron, 0.5 weight percent carbon, balance cobalt. After degreasing, the buttons were coated by pack cementation with a layer about 0.003 inch thick of a rhodium-modified platinum aluminide bond coat. This coating process included electroplating the specimens first with rhodium and then with platinum, followed by the pack aluminiding treatment as described for Example 1. The bond coat was grit blasted followed by vapor degreasing, and was thereafter coated with a ceramic top coat of nominal composition zirconium oxide-8 weight percent yttrium oxide to a thickness of about 0.005 inches, as described in Example 1.

Three specimens were cyclic furnace tested at 1925°F. for 700 cycles with no loss of coating. The coating process was consequently judged to be successful.

EXAMPLE 3

Fifty-three button specimens of the nickel-based superalloy Rene N5 were coated and tested. Rene N5 has a nominal composition of 7.5 weight percent cobalt, 7.0 weight percent chromium, 6.2 weight percent aluminum, 6.5 weight percent tantalum, 5.0 weight percent tungsten, 3.0 weight percent rhenium, 1.5 weight percent molybdenum, 0.15 weight percent hafnium, 0.05 weight percent carbon, 0.004 weight percent boron, remainder nickel. The alloys for the buttons were melted in vacuum and cast into single crystals using techniques well known in the art. Several specimens each were coated with a layer about 0.003 inches thick of the nickel aluminide bond coat in accordance with the invention, using pack cementation, tape cementation, and vapor deposition. Other specimens were coated with a platinum-aluminide bond coat in a thickness of 0.0025 inches. Still others were coated by electron beam deposition with about 0.004 inches of a NiCoCrAlY overlay bond coat. A ceramic topcoat of nominal composition zirconium oxide-8 weight percent yttrium oxide was deposited upon each of the bond coated specimens to a thickness of about 0.005 inches.

The buttons were successfully coated with bond coats by various procedures. The first group of 30 buttons was coated with nickel aluminide bond coat by pack cementation, using the approach described in Example 1.

The second group of 3 buttons was coated with nickel aluminide by tape cementation. The buttons were first cleaned by ultrasonic degreasing. One surface of each button was overlaid with a 0.020 inch thick tape consisting of a mixture of aluminum and iron powder plus an organic binder, then placed in a bed of an inert aluminum oxide powder and heated to 1925°F. for two hours in hydrogen. The thickness of the aluminide coating so formed was measured to be about 0.0035 inch.

The third group of 4 buttons was coated with nickel aluminide by chemical vapor deposition. The buttons were first cleaned by chemical degreasing. The buttons were then coated with nickel aluminide by a commercially available vapor deposition process (Chromalloy RT69) as is well known in the industry.

The fourth group of 10 buttons was coated with platinum aluminide bond coat by a two-step process. Platinum was first electroplated onto the surface of the specimens. The specimens were subjected to the pack cementation process of Example 1 to form the platinum aluminide coating. The coating is designated as Chromalloy RT 22.

The fifth group of 6 buttons was coated with a prior art NiCoCrAlY bond coat applied by its conventional vapor deposition technique, for comparison with the buttons prepared by the present approach. The buttons were first cleaned by degreasing. The buttons were coated with NiCoCrAlY bond coat having a nominal composition of 32 weight percent cobalt, 20 weight percent chromium, 8 weight percent aluminum, 0.3 weight percent yttrium, balance nickel, using a conventional vapor deposition process. The thickness of the bond coat was about 0.004 inch.

The upper surface of the bond coat of each button of the samples in groups 1–5 was oxidized to form an oxidized layer 28. Oxidation occurs as a result of heating in the preheat chamber prior to application of the top coat. Ceramic topcoat 30 was applied over the top of the oxidized layer 28 of each of the buttons in groups 1–5 by the physical vapor deposition apparatus previously described in relation to Example 1.

The coated specimens of groups 1–5 were cyclic furnace tested in a cycle consisting of a 10 minute heat up to 2075°F., a 45 minute hold at 2075° F., and a 10 minute cooling period in flowing air to about 200°F. The specimens were periodically visually examined at the completion of such cycles to evaluate coating performance. The failure criterion was established as the number of cycles to the point where 10 percent of the area of the coating was lost.

The results are summarized in the following table:

| Group | Coating System | Tests | Avg. Cycles To Failure |
|---|---|---|---|
| 1 | nickel aluminide, pack | 30 | 280 |
| 2 | nickel aluminide, tape | 3 | 240 |
| 3 | nickel aluminide, vapor deposition | 4 | 375 |
| 4 | platinum aluminide | 10 | 380 |
| 5 | NiCoCrAlY (prior art) | 3 | 103 |

The samples coated with aluminide bond coatings (samples of groups 1–4) outlast those coated with the Group 5 NiCoCrAlY bond coating by a factor of at least two to three.

Thus, the present approach provides an advancement in the protection of nickel-based superalloy substrates and cobalt-based superalloy substrates by thermal barrier coating systems. Although the present invention has been described in connection with specific examples and embodiments, it will be understood by those skilled in the arts involved, that the present invention is capable of modification without departing from its spirit and scope as represented by the appended claims.

What is claimed is:

1. A superalloy article having a thermal barrier coating system thereon, comprising:
    a substrate made of a material selected from the group consisting of a nickel-based superalloy and a cobalt-based superalloy; and
    a thermal barrier coating system on the substrate, the thermal barrier coating system including
        an intermetallic bond coat overlying the substrate, the bond coat being selected from the group consisting of a nickel aluminide and a platinum aluminide intermetallic compound,
        a thermally grown aluminum oxide layer overlying the intermetallic bond coat, and
        a ceramic topcoat overlying the aluminum oxide layer.

2. The article of claim 1, wherein the intermetallic bond coat is from about 0.001 to about 0.005 inches thick.

3. The article of claim 1, wherein the ceramic topcoat is from about 0.005 to 0.015 inches thick.

4. The article of claim 1, wherein the ceramic topcoat has a columnar grain structure wherein the columnar axis is substantially perpendicular to the surface of the intermetallic bond coat.

5. The article of claim 1, wherein the ceramic topcoat includes zirconium oxide and yttrium oxide.

6. The article of claim 1, wherein the ceramic topcoat is zirconium oxide plus from about 6 to about 20 percent by weight yttrium oxide.

7. The article of claim 1, wherein the article is a gas turbine blade.

8. The article of claim 1, wherein the intermetallic coating includes at least one alloying element that does not alter the intermetallic character of the coating.

9. The article of claim 2, wherein the layer of aluminum oxide is from about $1.2 \times 10^{-6}$ to about $1.2 \times 10^{-4}$ inches thick.

10. A superalloy article having a thermal barrier coating system thereon, comprising:
    a substrate made of a superalloy selected from the group consisting of a nickel-based superalloy and a cobalt-based superalloy; and
    a thermal barrier coating system on the substrate, the thermal barrier coating system including
        an aluminide intermetallic bond coat upon the substrate, the bond coat being selected from the group consisting of a nickel aluminide and a platinum aluminide, the bond coat having a thickness of from about 0.001 to about 0.005 inches thick,
        a layer of a thermally grown aluminum oxide upon the intermetallic bond coat, the layer of aluminum oxide being from about $1.2 \times 10^{-6}$ to about $1.2 \times 10^{-4}$ inches thick, and
        a ceramic topcoat upon the layer of aluminum oxide, the ceramic topcoat having a composition of zirconium oxide plus from about 6 to about 20 weight percent yttrium oxide and a columnar grain structure wherein the columnar axis is substantially perpendicular to the surface of the intermetallic bond coat.

11. The article of claim 10, wherein the nickel aluminide is NiAl.

12. A process for preparing a superalloy article having a thermal barrier coating system thereon, comprising:
    furnishing a substrate made of a nickel-based superalloy;
    depositing upon the surface of the substrate an aluminide intermetallic coating that has a substantially smooth upper surface, said bond coating being selected from the group consisting of a nickel aluminide and a platinum aluminide intermetallic compound;
    thermally oxidizing the upper surface of the intermetallic coating to form an aluminum oxide layer; and
    depositing upon the surface of the aluminum oxide layer a ceramic topcoat by physical vapor deposition.

13. The process of claim 12, wherein the temperature of the substrate during the step of depositing the intermetallic coating is greater than about 1800°F.

14. The process of claim 12, wherein the temperature of the substrate during the step of depositing the ceramic topcoat is from about 1700°F. to about 1900°F.

15. The process of claim 12, further including the step of oxidizing the surface of the intermetallic coating adjacent the ceramic topcoat to form aluminum oxide.

16. The process of claim 12, wherein the aluminide is platinum rhodium aluminide.

17. A thermal barrier coating system for metallic substrates, comprising:
    an intermetallic bond coat overlying a substrate selected from the group consisting of nickel-based superalloys and cobalt-based superalloys, the bond coat being selected from the group consisting of a nickel aluminide and a platinum aluminide intermetallic compound, and
    a ceramic topcoat overlying the intermetallic coating.

18. The coating system of claim 17, wherein the bond coat is oxidized to form an aluminum oxide layer between the bond coat and the topcoat.

19. The article of claim 1, wherein the substrate is the nickel-based superalloy Rene N5, having a nominal composition of 7.5 weight percent cobalt, 7.0 weight percent chromium, 6.2 weight percent aluminum, 6.5 weight percent tantalum, 5.0 weight percent tungsten, 3.0 weight percent rhenium, 1.5 weight percent molybdenum, 0.15 weight percent hafnium, 0.05 weight percent carbon, 0.004 weight percent boron, remainder nickel.

* * * * *